(12) United States Patent
Devlin et al.

(10) Patent No.: US 6,432,537 B1
(45) Date of Patent: *Aug. 13, 2002

(54) DIAMOND-LIKE-CARBON COATED ARAMID FIBERS HAVING IMPROVED MECHANICAL PROPERTIES

(75) Inventors: David James Devlin, Los Alamos; Don Mayo Coates, Santa Fe; Thomas Arthur Archuleta, Espanola, all of NM (US)

(73) Assignees: E.I. du Pont de Nemours and Company, Wilmington, DE (US); The Reagents of the University of California, Oakland, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/077,514

(22) PCT Filed: Nov. 18, 1996

(86) PCT No.: PCT/US96/18439
§ 371 (c)(1), (2), (4) Date: May 29, 1998

(87) PCT Pub. No.: WO97/20982
PCT Pub. Date: Jun. 12, 1997

Related U.S. Application Data
(60) Provisional application No. 60/007,834, filed on Dec. 1, 1995.

(51) Int. Cl.[7] ................................................ H05H 1/24
(52) U.S. Cl. .................... 428/408; 428/368; 427/577; 427/904
(58) Field of Search ........................ 427/577, 249.7, 427/249.3, 904, 122, 408, 368, 249.1; 428/408, 368

(56) References Cited

U.S. PATENT DOCUMENTS

| | | | |
|---|---|---|---|
| 4,204,542 A | | 5/1980 | Bokros et al. |
| 4,265,982 A | | 5/1981 | McCreary et al. |
| 5,021,258 A | | 6/1991 | McGarry |
| 5,431,968 A | | 7/1995 | Miller et al. |
| 5,431,988 A | * | 7/1995 | Miller et al. ............... 427/577 |
| 5,578,901 A | * | 11/1996 | Blanchet-Fincher et al. ............... 313/496 |
| 5,876,808 A | * | 3/1999 | Hall et al. ............... 427/573 |
| 6,037,016 A | * | 3/2000 | Devlin et al. ............ 427/249.7 |

FOREIGN PATENT DOCUMENTS

| | | |
|---|---|---|
| WO | WO 95 22169 | 8/1995 |
| WO | WO 95 26879 | 10/1995 |

OTHER PUBLICATIONS

U.S. application Ser. No. 08/755,439, Devlin et al., filed Nov. 26, 1996.

Database WPI, "Semiconductor Energy Lab", *Derwent Publications Ltd.*, London, Abstract, Jul. 8, 1991, No page numbers.

David J. Devlin, et al., "Diamond Like Carbon Coated "Kevlar" For Improved Mechanical Properties", *Electrochemical Society Proceedings*, vol. 96, No. 5, 691–698, 1996.

(List continued on next page.)

Primary Examiner—Bret Chen

(57) ABSTRACT

A process for improving the mechanical properties, particularly the flexural rigidity, of aramid fibers by directly depositing a diamond-like-carbon coating onto the surface of the fibers is disclosed. Diamond-like-carbon (DLC) coated aramid fibers having increased flexural rigidity are also disclosed. DLC coated aramid fibers show an increase in flexural rigidity and suppression of low yielding behavior when compared to uncoated aramid fibers.

9 Claims, 3 Drawing Sheets

OTHER PUBLICATIONS

Iqbal S. Athwal, et al., "DLC Films By Plasma Assisted Chemical Vapor Deposition Near Room Temperature", *Diamond and Related Materials*, vol. 2, No. 12, 1483–1489, Nov. 1, 1993.

S. R. P. Silva, et al., "Diamond–Like Carbon Thin Film Deposition Using A Magnetically Confined r.f. PECVD System", *Diamond and Related Materials*, vol. 4, No. 7, 977–983, May 15, 1995.

F. J. McGarry, et al., "Ceramic Coated Rigid Rod Polymer Fibers", *SAMPE Quarterly*, 35–38, Jul., 1992.

S. R. Allen, "Tensile Recoil Measurement of Compressive Strength for Polymeric High Performance Fibres", *Journal of Materials Science*, vol. 22, 853–859, 1987.

* cited by examiner

DIAMOND-LIKE-CARBON COATED ARAMID FIBERS HAVING IMPROVED MECHANICAL PROPERTIES

CROSS-REFERENCE TO RELATED APPLICATIONS

This application claims the benefit of U.S. Provisional Application 60/007,834, filed Dec. 1, 1995 and PCT International Application PCT/US96/18439, filed Nov. 18, 1996, wherein the United States was a designated country.

FIELD OF THE INVENTION

The invention generally relates to a process for improving the mechanical properties of aramid fibers. In particular, the invention relates to a process for improving the flexural rigidity of aramid fibers by depositing a diamond-like-carbon coating on said fibers. This invention is the result of a contract with the United States Department of Energy (Contract No. W-7405-ENG-36).

BACKGROUND OF THE INVENTION

Since at least the early 1960's liquid crystalline polymers have been used to produce high strength fibers. Well known examples of these types of fibers include aramid fibers made from highly-oriented rod-like polymers of poly (paraphenylene terephthalamide), well known as KEVLAR® aramid fibers commercially available from E. I. du Pont de Nemours and Company, Wilmington, Del. or TWARON® fibers, commercially available from AKZO Nobel NV, Netherlands. These aramid fibers provide exceptional tenacity and a high tensile modulus. Breaking strengths of 2.3–3.4 GPa, with a modulus of 55–143 GPa, are typical for these fibers. This, combined with their low specific gravity and thermal stability, has resulted in improved performance in many structural applications such as aircraft, boats, sporting goods, missiles and armor. However, a major draw back with these types of fibers has been their relatively poor flexural rigidity and compressive properties. Fibers yield at low values of stress on the order of 400 MPa with the formation of kink bands.

In order to alleviate this difficulty, much effort has gone into attempts to cross-link the polymer in the filaments to improve mechanical properties, but to date there has been little success. Another approach has been to coat the fiber with a sufficiently high modulus material to, in effect, "girdle" the filaments preventing buckling. Early work by McGarry et al. (see F. J. McGarry et al., SAMPE Quarterly, p. 35, July 1993) demonstrated the effectiveness of this approach with vapor deposited alumina coatings. Recently, enhanced properties have been reported for the microwave plasma assisted organometallic deposition of TiN coatings on KEVLAR® aramid fibers.

Aramid fibers have also been coated with a thin, smooth, adherent isotropic carbon coating for use as medical sutures where biocompatability is important (see U.S. Pat. No. 4,204,542 (Bokros et al.)). The carbon coating is deposited on the fiber substrate using vacuum-vapor deposition (VVD). Moreover, diamond-like-carbon coatings have also been deposited on aramid fibers by initially pre-coating the fibers with a thin nickel layer to confer conductivity (see WO 95/22169 (Blanchet-Fincher et al.)). However, although the direct coating of aramid fibers is not straightforward, it is desirable to coat such fibers directly without the need for any intermediate metal layer in order to improve the mechanical properties of the aramid fibers.

In order to overcome the deficiencies and disadvantages of the prior art, what is needed is a process for improving the mechanical properties, in particular the flexural rigidity, of aramid fibers. Other objects and advantages of the present invention will become apparent to those skilled in the art upon reference to the attached figures and the detailed description of the invention which hereinafter follows.

SUMMARY OF THE INVENTION

The present invention provides a process for improving the mechanical properties, preferably the flexural rigidity, of aramid fibers. The process comprises directly coating an aramid fiber with a high modulus, high strength material such as diamond-like-carbon.

The invention also provides for diamond-like-carbon coated aramid fibers having improved mechanical properties, (e.g., flexural rigidity), compared to uncoated aramid fibers. When diamond-like-carbon (DLC) coatings are applied directly to aramid fibers, there is an increase in flexural rigidity and suppression of low yielding behavior when the fibers are tested and their mechanical properties evaluated.

DETAILED DESCRIPTION OF THE PREFERRED EMBODIMENTS

Figure 1:
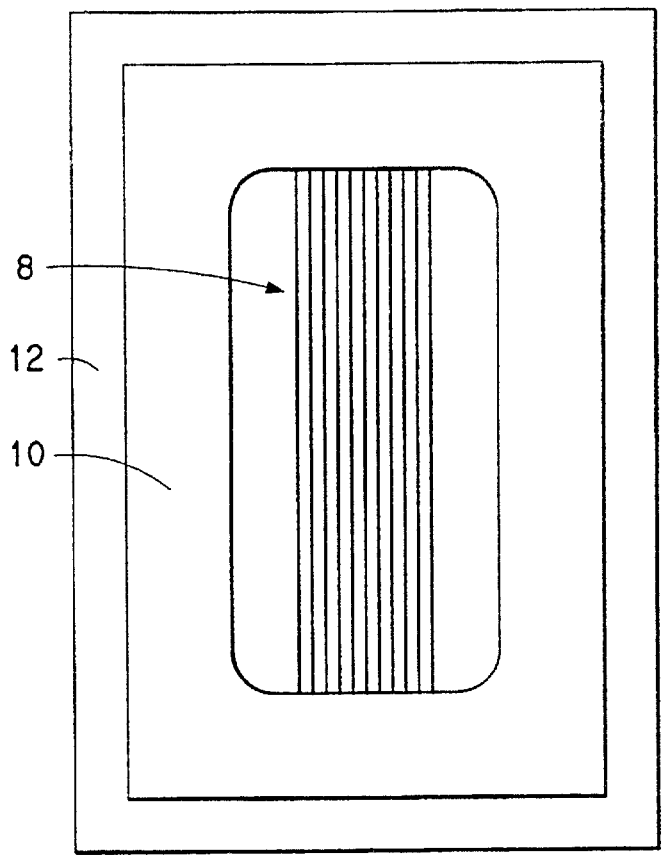
FIG. 1 is an illustration of a cathode arrangement for the plasma deposition of diamond-like-carbon on aramid fibers.

It has been discovered that coating aramid fibers, such as KEVLAR® aramid fibers commercially available from E. I. du Pont de Nemours and Company, with diamond-like-carbon (DLC) improves their mechanical properties, specifically the flexural rigidity of those fibers as compared to uncoated aramid fibers.

As used herein, diamond-like-carbon or DLC means carbon with an appropriate short range order, i.e., an ordered arrangement of atoms less than about 10 nanometers (nm) in any dimension. Diamond-like-carbon (DLC) is a smooth amorphous solid made up of a highly cross-linked carbon network with a substantial degree of $sp^3$ bonding. This $sp^3$ bonding results in mechanical properties approaching that of diamond itself. The fraction of $sp^3$ bonding can vary depending on the process and processing conditions, from 10% to 90% yielding films with properties ranging from polymer-like to diamond-like. Typical values of modulus for hard coatings are in the range of about 20 to about 177 GPa. This, combined with low density, low coefficient of friction, high hardness and low deposition temperatures, makes DLC an ideal candidate for coating aramid fibers. Some typical properties of DLC and KEVLAR® aramid fibers are shown in Table 1 below.

TABLE 1

|  | E GPa | σ GPa | ρ g/cc |
|---|---|---|---|
| KEVLAR ® | 83 | 3.2 | 1.44 |
| DLC | 20–177 | — | 1.8–2.8 |

DLC may be deposited by a variety of techniques centered on energetic ion bombardment, such as plasma assisted chemical vapor deposition (CVD), ion beam assisted sputtering, cathodic arc and laser ablation of carbon targets. The following description focuses on a radio frequency (RF) plasma-assisted CVD technique for the deposition of DLC on aramid fibers and describes a method of evaluating the flexure properties of single filaments, although the invention is not limited to this embodiment.

In the non-limiting examples that follow, aramid fibers were coated using a parallel plate 13.56 Mdz RF plasma technique. Typically, the aramid fibers to be coated by DLC have a thickness from about 5 to about 100 microns, preferably about 10 to about 40 microns. The apparatus used consists of a diffusion pumped high vacuum chamber with mass flow controllers and conductance valve for operation at reduced pressure. The basic process requires the formation of a plasma between a grounded anode and a powered cathode. The anode-cathode system is deliberately asymmetric such that a negative DC self-bias results at the cathode. The plasma consists of a hydrocarbon gas, such as methane, which is disassociated and ionized in the plasma. Ions are accelerated across the plasma sheath towards the cathode as a result of the self-biasing. Ion bombardment is a critical aspect of depositing DLC with the desired properties. For the pressure regime of 50 to 100 microns, biasing on the order of several 100 volts to a 1000 volts is required. Low bias potentials result in polymer-like properties while too high a potential will yield a glassy or graphitic carbon film.

Unlike conventional thermal CVD, the ion bombardment aspect of the process results in a line-of-sight deposition. Conformal coating is possible by careful design of the anode-cathode arrangement. To fully coat around the fibers, deposition was performed on spread fiber tows and coated one side at a time.

Thick coatings of up to 2 microns were deposited by mounting the fibers 8 between two steel plates 10 with a section 2.5 by 5 centimeters, removed from its center as illustrated in FIG. 1. The plate is mounted to the cathode 12 and can be removed and turned to coat both sides of the fiber. DLC was deposited on the fibers under the conditions listed in Table 2 below.

TABLE 2

|  | Coating Thickness microns | Gas | Pressure Pa | Power watts | Bias Volts | Treatment Time (min.) |
|---|---|---|---|---|---|---|
| Pretreatment | — | Ar | 4.7 | 65 | −500 | 15 |
| DLC coating | 2.3 | $CH_4$ | 11.3 | 85 | −520 | 240 |

To improve adhesion of the coating to the fiber, an argon etching process using the same experimental configuration was employed prior to deposition. After the initial DLC deposition was complete, the plates containing the fiber were turned over and the other side of the fiber was coated using the same procedure. Well adhered coatings up to two microns thick were obtained with this procedure.

Figure 2:
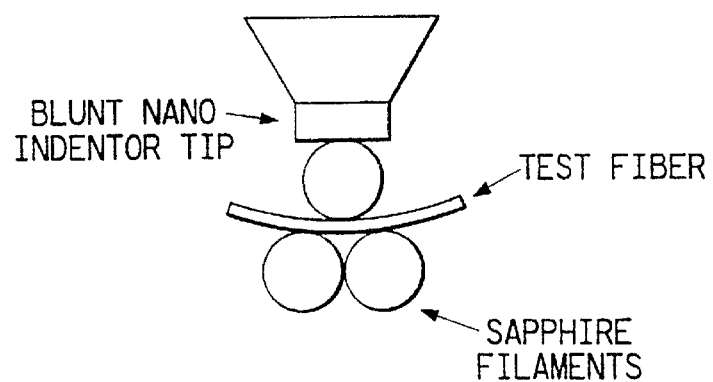
FIG. 2 is an illustration of a three point bend tester used to test the mechanical properties of aramid fibers.

Evaluation of the axial compressive properties of single fibers is typically a difficult problem. A number of methods have been devised, most notably the tensile recoil test developed by Allen [see S. R. Allen, J. Mat. Sci., 22, 853 (1987)). Alternatively, information on coating performance can be obtained from measurements of flexural properties. To this end, a three point bend test for single fibers was developed for use with a nanoindentor (commercially available from NanoInstruments, Inc., Knoxville, Tenn.). The method and apparatus are generally illustrated in FIG. 2. Greater detail is provided; in U.S. provisional patent application No. 60/007,849 by Devlin et al. entitled "Flexural Test for Small Diameter Fibers," filed concurrently herewith, the contents of which are incorporated herein by reference.

A set of sapphire fibers 2.5 cm in length and 140 microns in diameter were laid parallel and adjacent to one another and epoxied to a sapphire flat. A third fiber was placed on top and between the two and epoxied at one end. The diamond tip of the indentor was replaced with a flat (blunt) 200 micron diameter tip. The test fiber (i.e., aramid fiber) was placed across the two sapphire fibers on the flat and beneath the third fiber. By pushing on the third sapphire fiber with the blunt tip, the fiber was deflected between the two support fibers. The lengths and span of the sapphire fibers were chosen such that the force for deflection of the third sapphire fiber was small compared to that of the test fiber and may be neglected. Test fibers were easily mounted by simply slipping them between the sapphire fibers and mounting the fixture in the indentor sample holder. Standard operation of the indentor was used to obtain load and displacement data including the force required for any measured fiber deflection. All tests were taken to a maximum displacement of 4.0 microns. The results were analyzed using the Standard Flexure Formula modified for the displacement and variation in fiber span or gauge length due to rotation about the sapphire fiber support assembly. For an assembly such as shown in FIG. 2, the gauge length becomes the gap or depression distance in the planar surface rather than the span gap between the two fibers. For small displacements, the equation reduces to the following equation which is substantially equivalent to the Standard Flexure Formula:

$$P = \frac{48EI}{D^3}\lambda$$

where:
P is the applied load as measured by the indentor (in Newtons);
D is the diameter of the sapphire support fiber (in meters);
E is the modulus of the tested fiber (in Pascals);
I is the moment of inertia of the tested fiber (in meters to the fourth power ($m^4$)); and
λ is the displacement as measured by the indentor (in meters).

The fiber diameters were measured by scanning electron micrographs (SEM). The technique was evaluated with silicon carbide (SiC) fibers ("NICALON" SiC fibers commercially available from Dow Corning Corporation of Auburn, Mich.) of known modulus. Single fiber tensile tests were performed using a micro tensile tester described by Petrovic (see J. J. Petrovic et al., J. Mat. Sci., 20, 1167 (1985)). Typical gauge lengths were on the order of 1 centimeter.

The DLC coatings were smooth and reasonably well adhered. For fibers coated one side at a time, a knit line was sometimes observed in some regions. Thick coated fibers curled, presumably due to the residual compressive stress associated with DLC coating. For thin coatings, the effect was less pronounced.

Figure 3:
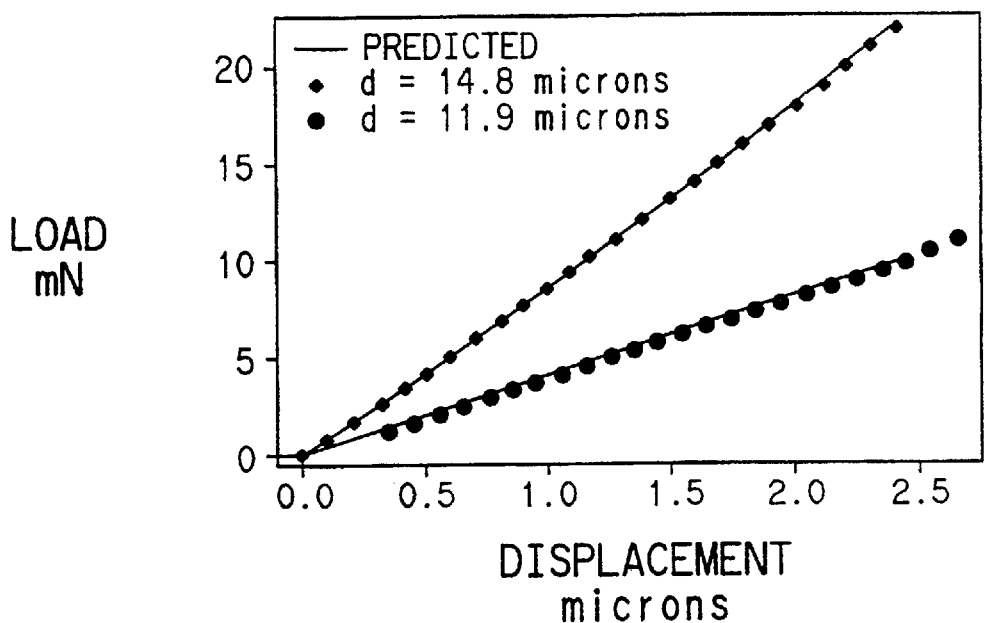
FIG. 3 is a plot showing the results of three point bend tests on NICALON® SiC fibers of two different diameters.
Figure 4:
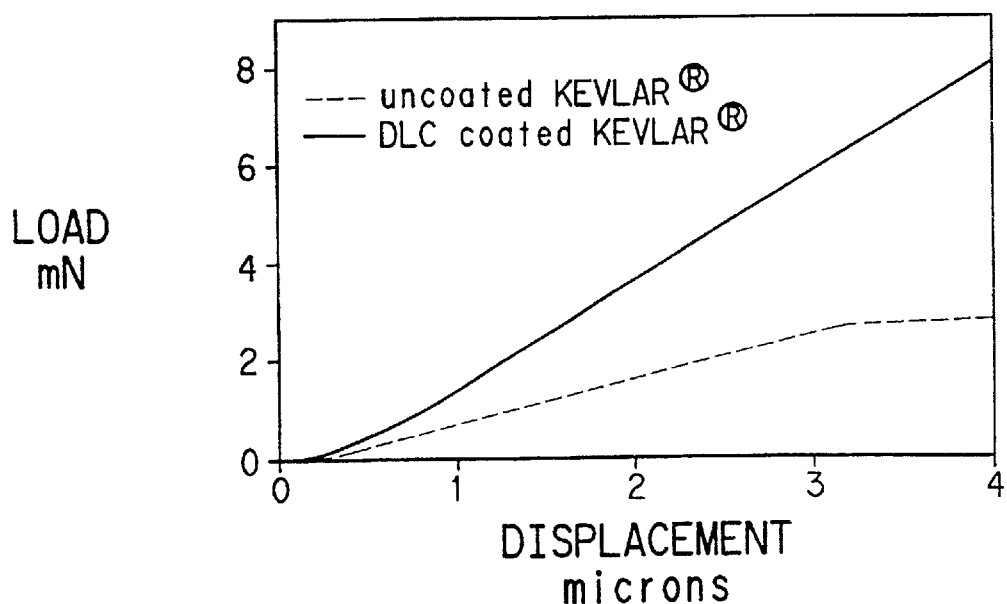
FIG. 4 is a plot showing the results of three point bend tests on coated and uncoated KEVLAR® aramid fibers.

FIG. 3 shows the results of bend tests on NICALON® silicon carbide (SiC) fibers of different diameters using the modified nanoindentor. Calculation of the modulus for the fibers results in a value of 187 GPa in good agreement with the reported value of 193 GPa, demonstrating the validity of the testing technique. FIG. 4 shows the results of measurements on an uncoated KEVLAR® aramid fiber and a KEVLAR® aramid fiber coated with 2.3 microns of DLC.

The yielding behavior at low loads and displacement is evident for the uncoated KEVLAR® aramid fiber. Yielding occurs at a displacement of 3.2 microns corresponding to a maximum strain of 1.2%. Increases in flexural rigidity for the 2.3 micron coated KEVLAR® aramid fiber are apparent with no evidence of failure up to the displacement of 4 microns.

Figure 5:
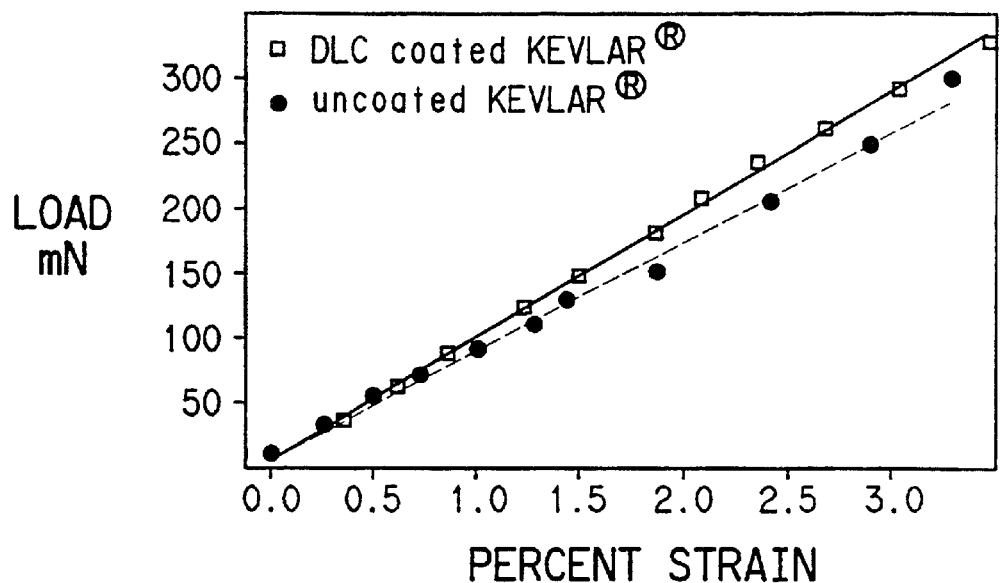
FIG. 5 is a plot showing the results of tensile tests on diamond-like-carbon coated KEVLAR® aramid fibers (2 micron thick coating) and uncoated KEVLAR® aramid fibers.

Tensile data for an uncoated and a coated KEVLAR® aramid fiber (2 micron DLC coating) is shown in FIG. 5. A breaking stress of 1.6 GPa and a modulus of 48 GPa were obtained for the coated KEVLAR® aramid fiber compared to 2.93 GPa and 90.4 GPa for the uncoated KEVLAR® aramid fiber. Results of mechanical tests are summarized in Table 3 below.

TABLE 3

| | Diameter (μm) | Gauge (μm) | Failure Load (mN) | σ GPa | E GPa |
|---|---|---|---|---|---|
| KEVLAR® (flexural) | 11.6 | 140 | — | — | 63.5 |
| KEVLAR® (tensile) | 12.0 | 5138 | 331 | 2.93 | 90.4 |
| DLC/KEVLAR® (flexural) | 17.2 | 140 | — | — | 32.5 |
| DLC/KEVLAR® (tensile) | 16.8 | 5641 | 358 | 1.62 | 48.5 |

The tensile data for the coated KEVLAR® aramid fiber shows a breaking strength essentially the same as that of the uncoated KEVLAR® aramid fiber despite its increased diameter. A calculation of the overall modulus and tensile strength yields values of 48.5 and 1.62 GPa, respectively, however, on the basis of the original fiber diameter values of 93.1 and 3.16 GPa were obtained. Since the modulus of DLC and KEVLAR aramid fibers are comparable, significant increases in tensile behavior would not be expected. The overall decrease suggests either a lower modulus coating or a discontinuous coating. If the DLC modulus where significantly higher, premature failure of the coating due to flaws or pre-existing cracks in the coatings would eliminate its ability to carry load in tension.

However, the behavior in bending was different. Clear improvements in flexural rigidity were observed for the coated KEVLAR® aramid fiber. No yielding behavior was observed up to the 4 micron displacement limit used on the test. In bending, maximum stress occurs at the surface and the mechanical properties were largely governed by the coatings. Under these conditions, the coating performs well. The flexural modulus for the uncoated KEVLAR® aramid fiber, assuming isotropic behavior, was calculated to be 63.5 which is higher than that reported by McGarry et al. (see F. J. McGarry, SAMPE Quarterly, p. 35 (July 1992)). The same calculation for the coated KEVLAR® aramid fiber yields an overall modulus of 32.4 GPa. When this calculation was performed, assuming the entire load was carried by the coating, a flexural modulus of 63.1 GPa was obtained. This value represents the modulus of the DLC coating and was essentially the same as the measured tensile modulus of KEVLAR® aramid fibers.

Figure 6:
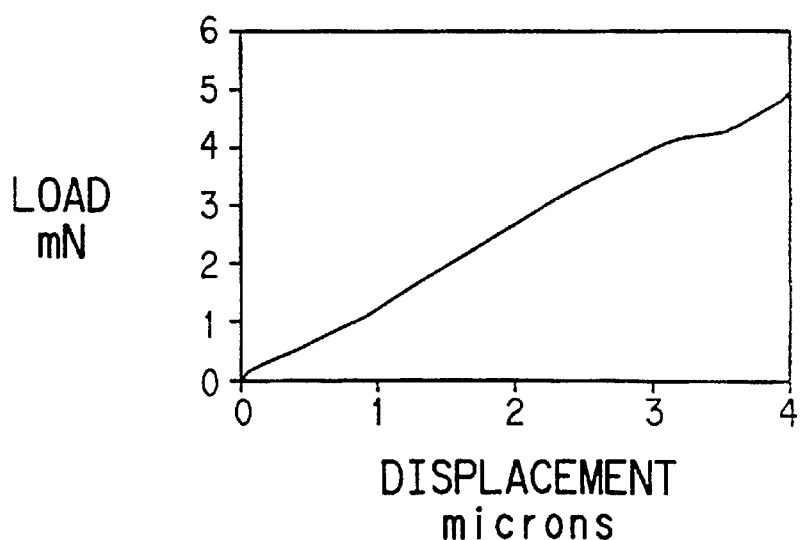
FIG. 6 is a plot showing the results of a three point bending test on KEVLAR® aramid fibers that have been coated with a submicron coating of diamond-like-carbon.

The compressive stress of DLC films was high, often as high as 2 GPa. This might be expected to contribute to the girdling effect. In a positive fashion, however, it did result in excessive curling of fibers for the thick, 2 micron coatings. Varying process conditions can reduce these stresses, but at the expense of desired properties. Preliminary results on submicron coatings have shown minimal curling. FIG. 6 shows the bending behavior of one such KEVLAR® aramid fiber.

The fiber shows the onset of yielding followed by a recovery. Although this behavior is not fully understood, it may be the result of a discontinuous coating or crack. Filament buckling within the crack would be possible but constrained due to the finite width of the crack. Further buckling was prevented by the intact coating.

An overall increase in flexural rigidity was observed for coated KEVLAR® aramid fibers. The results of tensile tests showed no increase in tensile strength despite an increase in fiber radius. The breaking strength was effectively the same as that of uncoated KEVLAR® aramid fibers. The flexural DLC coating modulus, assuming the load was carried by the coating was calculated at 63.1 GPa. This is the same as the measured tensile modulus of KEVLAR® aramid fibers. The additional decease in the overall tensile modulus of the material may be attributed to premature coating failure or existing cracks in the coating.

Submicron coatings show an unusual recovery behavior in bendings. Again, this may be attributed to coating failure or pre-existing cracks.

EXAMPLES

The following non-limiting examples further describe and enable the present invention.

Example 1

KEVLAR® 49 aramid fibers from E. I. du Pont de Nemours and Company (Wilmington, Del.) having no surface finish were coated using a parallel plate 13.56 MHz RF plasma technique as shown in FIG. 1. The system consisted of a diffusion pumped high vacuum chamber with mass flow controllers and conductance valve for operation at reduced pressure. The basic process required the formation of a plasma between a grounded anode and powered cathode. The anode-cathode system was deliberately asymmetric such that a negative DC self-bias resulted at the cathode. The plasma consisted of a hydrocarbon gas of methane, which was disassociated and ionized in the plasma. Ions were accelerated across the plasma sheath towards the cathode as a result of the self-biasing. Ion bombardment was a critical aspect of depositing DLC with the desired properties. For the pressure regime of 50 to 100 microns biasing on the order of several 100 volts to a 1000 volts was required. Low bias potentials result in polymer-like properties while too high a potential will yield a glassy or graphitic carbon film.

A portion of the fiber bundles, 5 cm in length was cut from the tow and ⅔ of the fiber bundle removed. The remainder of the bundle was spread by hand and mounted on a steel plate approximately 10×13 cm. with a center section of dimensions 2.5×5 cm. removed. The fibers were held to the plate with welded metal clips. The plate with fibers was mounted to a second "cathode plate" and electrically isolated from the cathode plate with alumina spacers. This arrangement was placed in the vacuum system and isolated from ground. The cathode plate was electronically connected to a power output of a matching network which was in turn connected to an RF, 13.56 MHz power supply.

The vacuum chamber was evacuated to a base pressure of $10^{-6}$ torr. and backfilled with argon to a pressure $3.5 \times 10^{-5}$ torr. Sixty five watts of RF power was applied to the cathode resulting in a negative self-bias of approximately −500 volts DC. These conditions were used to sputter clean the fiber surface for a period of 15 minutes and improve film adhesion. Following the argon pretreatment, the RF power and argon was turned off and the system evacuated to $10^{-6}$ torr. Methane gas was introduced to pressure of $85 \times 10^{-6}$ torr. Sixty five watts of RF power was applied to the cathode resulting in a negative self bias of −520 volts DC. Deposition continued for 4 hours. At the end of this time the RF power and methane gas flow were discontinued and the chamber re-evacuated. The sample was allowed to cool. The chamber was backfilled with argon and opened to air. The stainless steel plate was removed from the cathode, turned over and re-fixtured to the cathode for coating the opposite side of the fibers. The chamber was evacuated as before and methane gas was introduced to a pressure of $85 \times 10^{-6}$ torr. Sixty five watts of RF power were applied to the cathode with a resulting negative self bias of −475 volts DC. Deposition was continued for an additional 4 hours.

The resultant material, i.e., the coated aramid fiber, was tested using the three point bend test previously described for use with a nanoindentor from NanoInstruments, Inc. (Knoxville, Tenn.). The results are shown in FIG. 5.

Example 2

As a goal to continuously and efficiently coat aramid fibers, a method for coating both sides of the fiber simultaneously was devised. The method is illustrated in FIG. 1. The cathode arrangement consisted of two parallel grids constructed from a stainless steel mesh. The grids were spaced 3 mm apart and formed the cathode assembly. The non-conducting fibers (i.e., the KEVLAR® 49 aramid fibers of Example 1) were passed between grids, and ions were accelerated through the grid from two directions striking the fibers. By maintaining the grid spacing to less than the cathode dark space, on the order of about one centimeter, the formation of a plasma and a virtual anode between the grids was avoided. While only static runs were performed, in a preferred practice, the aramid fiber or fibers would be continuously transported between the grid resulting in uniform coatings on both sides. Similar conditions and pretreatment to those previously described in Example 1 were used. Uniform coatings up to 0.1 microns were obtained. For thicker coatings, shadow effects from the grid were observed. In a continuous system shadowing would not be present.

Sixteen KEVLAR® 49 aramid fibers were spread by hand and taped across a open section of the steel plate 1.5 millimeters thick. A second plate identical to the first was attached such that the fibers were sandwiched between them but visible from both sides through the openings. Stainless steel mesh was attached to both plates covering the openings. This entire assembly served as the cathode. A 3 mm spacing between the steel mesh grids met the requirements necessary to avoid ionization between the grids while ions formed external to the cathode were accelerated across the dark space on both sides of the assemble due to the self-bias and passed through the grids to strike the fibers from both sides. The aramid fibers were then held between the grids as ions were accelerated through the grid from two directions to strike the fibers.

The assembly was mounted in the vacuum chamber isolated from ground, and electrically connected to the output of a matching network which in turn was connected to a 13.56 MHz RF power supply. The chamber was evacuated to $10^{-6}$ torr and subsequently backfilled with argon to a pressure $35 \times 10^{-6}$ torr. Sixty-five watts of RF power was supplied to the cathode assembly resulting in a negative self bias of approximately 500 volts DC. These conditions continued for a period of 15 minutes at the end of which the power and gas flow were discontinued and the chamber was evacuated to $10^{-6}$ torr. Methane gas was introduced to the chamber at pressure of $85 \times 10^{-6}$ torr. Eighty-five watts of RF power resulting in a negative self bias of 480 volts DC was applied to the cathode assembly. Deposition continued for 37 minutes at the end of which time the power and gas flow were discontinued and the chamber evacuated.

These samples were tested using the three point bend test and the results are plotted in FIG. 6.

For Examples 1 and 2 described above, DLC was deposited under the conditions summarized below in Table 4.

TABLE 4

| | Coating Thickness microns | Gas | Pressure torr $10^{-6}$ | Power watts | Bias Volts | Treatment Time (min.) |
|---|---|---|---|---|---|---|
| Pretreatment | — | Ar | 35 | 65 | −500 | 15 |
| Example 1 | 2.3 | $CH_4$ | 85 | 65 | −520 | 240 |
| Example 2 | 0.1 | $CH_4$ | 85 | 85 | −480 | 37 |

Although particular embodiments of the present invention have been described in the foregoing description, it will be understood by those skilled in the art that the invention is capable of numerous modifications, substitutions and rearrangements without departing from the spirit or essential attributes of the invention. Reference should be made to the appended claims, rather than to the foregoing specification, as indicating the scope of the invention.

What is claimed is:

1. A diamond-like-carbon coated aramid fiber wherein said diamond-like-carbon coating is deposited directly on the surface of said aramid fiber, said diamond-like-carbon coating is fully and uniformly coated around the aramid fiber up to a coating thickness of 2.3 microns, and the aramid fiber has substantially no yielding at a maximum stress of at least 1 GPa.

2. The aramid, fiber of claim 1 wherein the fiber is comprised of poly(paraphenylene terephthalamid).

3. A process for improving the flexural rigidity of an aramid fiber comprising depositing a diamond-like-carbon coating directly on the surface of said fiber wherein the the fiber to be coated is passed between a pair of electrically isolated parallel plates or grids that are part of a cathode assembly used in the formation of a plasma, and said plates or grids are spaced apart to avoid the formation of a plasma between the plates or grids.

4. The process of claim 3 wherein said diamond-like-carbon coating is deposited by radio frequency plasma assisted chemical vapor deposition.

5. The process of claim 3 wherein the fiber is comprised of poly(paraphenylene terephthalamide).

6. The process of claim 3 wherein the aramid fiber is sputter cleaned prior to coating with the diamond-like-carbon.

7. The process of claim 3 wherein the plates or grids are spaced apart less than the cathode dark space.

8. The process of claim 3 wherein the grids are constructed from stainless steel mesh.

9. The process of claim 2 wherein the diamond-like-carbon coating is fully and uniformly coated around the aramid fiber up to a coating thickness of 2.3 microns.

* * * * *